US006404243B1

(12) United States Patent
Koch, II et al.

(10) Patent No.: US 6,404,243 B1
(45) Date of Patent: Jun. 11, 2002

(54) SYSTEM AND METHOD FOR CONTROLLING DELAY TIMES IN FLOATING-BODY CMOSFET INVERTERS

(75) Inventors: Kenneth Koch, II, Ft Collins; William Weiner, Windsor, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/759,718

(22) Filed: Jan. 12, 2001

(51) Int. Cl.[7] .......... H03B 21/00

(52) U.S. Cl. .......... 327/107; 327/166; 327/176; 327/534

(58) Field of Search .......... 327/530, 534, 327/537, 108, 107, 166, 176; 257/351

(56) References Cited

U.S. PATENT DOCUMENTS 6,300,819 B1 * 10/2001 De et al. .......... 327/534
6,304,110 B1 * 10/2001 Hirano .......... 327/108

OTHER PUBLICATIONS

Mako IC Process Investigation (partially depleted SOI Literature) pp. 122 to 169 MM/YY unknown.

Dimitri A. Antoniadis, pp. 295–300, SOI CMOS as a Mainstream Low–Power Technology: A Critical Assessment Aug. 1997.

P. Lu, et al, pp. 1–6, Floating Body Effects i Partially–Depleted SOI CMOS Circuits; Aug. 1996.

Jacques Gautier, et al., pp. 16.1.1; 16.4.4; SOI Floating–Body, Device and Circuit Issues, Jul. 1997.

* cited by examiner

*Primary Examiner*—David Nelms
*Assistant Examiner*—Tu-Tu Ho

(57) ABSTRACT

The present invention discloses a floating body architecture CMOSFET inverter with body biasing inverters added for controlling the delay time of the inverter. At least one body biasing inverter is connected between the main inverter's input and the body terminals of the FETs of the inverter. By supplying a representation of the input voltage to the body terminals of the p-channel and n-channel FETs, the preferred embodiment of the present invention is able to control the history dependent delay time associated with the variable source-to-body voltages in floating body CMOSFET inverters. The delay time is minimized by adding an odd number of body biasing inverter stages into the main inverter circuit. The delay time can also be maximized by adding an even number of body biasing inverter stages into the circuit.

16 Claims, 2 Drawing Sheets

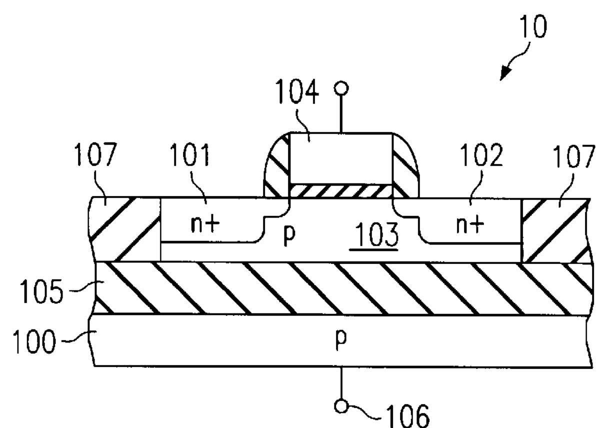
FIG. 1
(PRIOR ART)
FIG. 2A
(PRIOR ART)
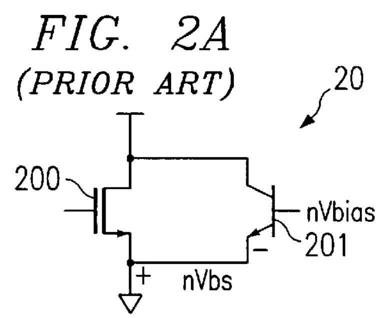
FIG. 2B
(PRIOR ART)
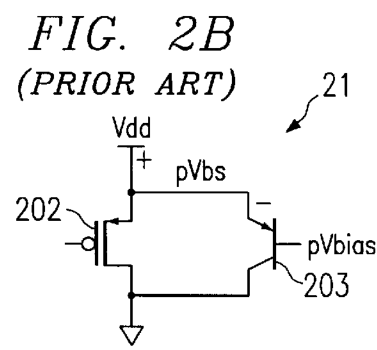
FIG. 3
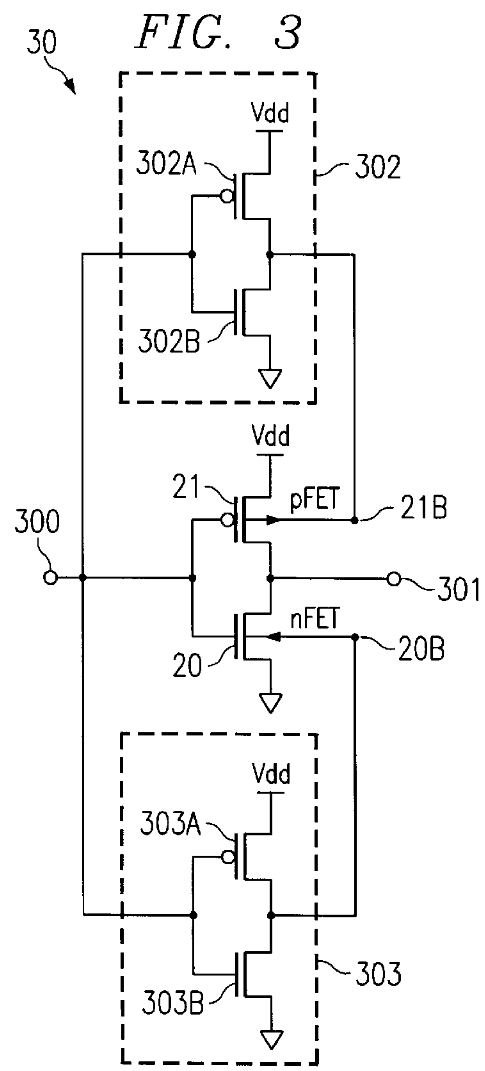

SYSTEM AND METHOD FOR CONTROLLING DELAY TIMES IN FLOATING-BODY CMOSFET INVERTERS

TECHNICAL FIELD

The present invention relates to complementary metal oxide semiconductor field effect transistor (CMOSFET) circuit topology and, in particular, a floating body CMOSFET inverter configuration having controllable logic state transition delay time.

BACKGROUND

As Moore's Law continues to drive the demand for faster computers and more highly-packed dense integrated circuit (IC) configurations, there is an increasing desire for circuit devices and topologies having lower power consumption and supply voltage requirements while increasing switching speed performance. Bulk CMOS technology has generally been able to increase overall switching speeds as well as reducing power and voltage requirements with decreasing circuit geometries to accommodate more densely packed IC chips.

One limitation of CMOS technology, however, which effects the overall switching speed, is the inherent parasitic capacitance usually found between drain and substrate or source and substrate. This capacitance typically consists of two components: the first component is the capacitance between the drain/source and the substrate or body; the other component is the capacitance between the drain/source and the channel-stop implant located under the field oxide region of the device. When switching between states, this capacitance generally must either discharge or charge before the device can complete state transition. The time required for this charging or discharging typically delays the overall switching speed of the device.

In silicon on insulator (SOI) devices, the substrate and body terminals are fully isolated dielectrically from the drain/source by a film of oxide traversing the device. This oxide, called the buried oxide, typically separates the body from the drain/source, and, because it traverses the device, removes the channel-stop implant found in regular bulk CMOS devices. Without the channel-stop, the overall drain/source-to-body capacitance is generally reduced to only the single component of drain/source-to-body capacitance. The lower overall capacitance, thus, increases the switching speeds of SOI architecture devices.

In addition to the reduced drain/source-to-body capacitance in SOI devices, speed and power consumption are usually further enhanced by allowing the substrate or body connection to float. The floating body configuration also beneficially allows construction of SOI devices using less chip area. While the floating body connection diminishes delay time, power consumption, and device area, there are a number of detrimental effects associated with this configuration.

Because the body is not connected at any certain point on the MOSFET device, body voltage will generally vary depending on the following conditions: the bias condition of the device; the capacitive coupling between the gate, source, drain, and body voltages; carrier generation (holes in nMOSFET, electrons in pMOSFET) caused by impact ionization; and the rate of generation/recombination in the space charge layer. The variation of the body voltage creates variations in the drain/source-to-body voltage, which, in turn, may lead to variations in the device threshold voltage. Variations in the threshold voltage of any FET device generally leads to unpredictable device operation. For example, a device configured to turn on at 2 volts may not turn on at all if the threshold voltage changes to a value greater than 2 volts. Conversely, a device configured to turn off at 0.3 volts may inadvertently turn on if the threshold voltage changes by a discernable value. This could have devastating and dangerous effects depending on the application of the device.

Another detrimental effect of the floating body is typically manifested in the activation of the parasitic bipolar transistor inherent in MOSFET devices. In a typical MOSFET, the areas of the source, body, and drain form a bipolar-type relationship ('npn' in nMOSFET devices; 'pnp' in pMOSFET devices). When the body is connected to ground or to the source or drain of the MOSFET, the drain/source-to-body voltage is such that the parasitic bipolar transistor usually remains off. However, in the floating body configuration found in SOI devices, the drain/source-to-body voltage may rise high enough to activate the bipolar transistor. Once activated, current will generally begin to flow through the bipolar device which may adversely effect, or at least create unpredictable effects on, the performance of the MOSFET.

In order to overcome these detrimental effects, body ties or body contacts have typically been fabricated into the devices to provide a direct connection between the body and one or another of the device terminals. These connections set the bias of the substrate or body, thus creating a predictable, if not fixed, drain/source-to-body voltage. However, these solutions typically negate the majority of the beneficial effects of the SOI architecture. For instance, the incorporation of body ties or body contacts generally increase the overall power consumption and propagation delay of the corresponding devices.

Logic inverters manufactured using the SOI CMOSFET architecture attempt to take advantage of the benefits of the faster switching speeds. However, these inverters exhibit history dependent delay, which is the variation in switching delay time caused by the variations in the SOI device's threshold voltages. As noted above, the floating body configuration of SOI MOSFET devices generally causes their drain/source-to-body voltage to vary, which, in turn, causes the variations in threshold voltage. With logic inverters, it is generally preferred to have a predictable or minimal delay in order to properly configure the circuit for operation. In order to ensure proper operation of SOI-based logic inverters, the SOI MOSFETs are usually modeled in the slowest state. In operation, the typical SOI MOSFET inverter delay will inconsistently vary between its shortest and longest times. While these circuit designs experience some measured improvement over the bulk architecture CMOS, there has not been a workable solution to negate the history dependent delay or even to control or minimize it.

It would, therefore, be desirable to have an inverter circuit manufactured using SOI CMOSFET devices, which includes the ability to control or even minimize the history dependent delay typical of SOI inverters.

SUMMARY OF THE INVENTION

The present invention is directed to a system and method for complementary metal oxide semiconductor field effect transistor (CMOSFET) inverters having a floating-body terminal, comprising a p-channel FET (pFET), and an n-channel FET (nFET), wherein the pFET and nFET are connected gate terminal-to-gate terminal and drain terminal-to-drain terminal. The inverter input is connected to the gate terminals of the pFET and nFET, while the inverter output is connected to the drain terminals of the pFET and nFET. The inverter preferably has at least one body biasing inverter having an input connected to the inverter input and an output connected to both the pFET's and nFET's body terminal.

The inverter's delay time can be manipulated by preferably connecting the inputs of the biasing logic inverters to the inverter input and preferably connecting the outputs of each of the biasing logic inverters included to the body terminals of each of the FET devices making up the floating-body CMOSFET inverter. In order to minimize the delay time, an odd number of biasing logic inverter stages are preferably added to the floating-body CMOSFET inverter, while maximizing the delay time is implemented by preferably adding an even number of biasing logic inverter stages.

Tying the body terminals of the CMOSFET inverter to a stable voltage source preferably diminishes the detrimental floating body effects. In the delay minimization configuration with an odd number of biasing inverter stages, the biasing inverters preferably set the pFET of the main inverter to the slowest state, while preferably setting the nFET of the main inverter to the fastest switching state. Similarly, in the delay maximization configuration with an even number of biasing inverter stages, the biasing inverters preferably set the pFET of the main inverter to the fastest state, while preferably setting the nFET of the main inverter to the slowest switching state. These stable voltages therefore overcome the history dependent delay inherent in floating body inverters such as SOI-constructed CMOSFET inverters.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIG. 1 is a cross-sectional partial view of a prior art SOI-constructed CMOSFET illustrating the n-channel (nFET) device;

FIG. 2A is a circuit diagram illustrating the internal parasitic bipolar transistor found in a prior art SOI-constructed nFET;

FIG. 2B is a circuit diagram illustrating the internal parasitic bipolar transistor found in a prior art SOI-constructed pFET;

FIG. 3 is a circuit diagram illustrating the preferred embodiment of the present invention which minimizes the delay time;

DETAILED DESCRIPTION

Figure 4:
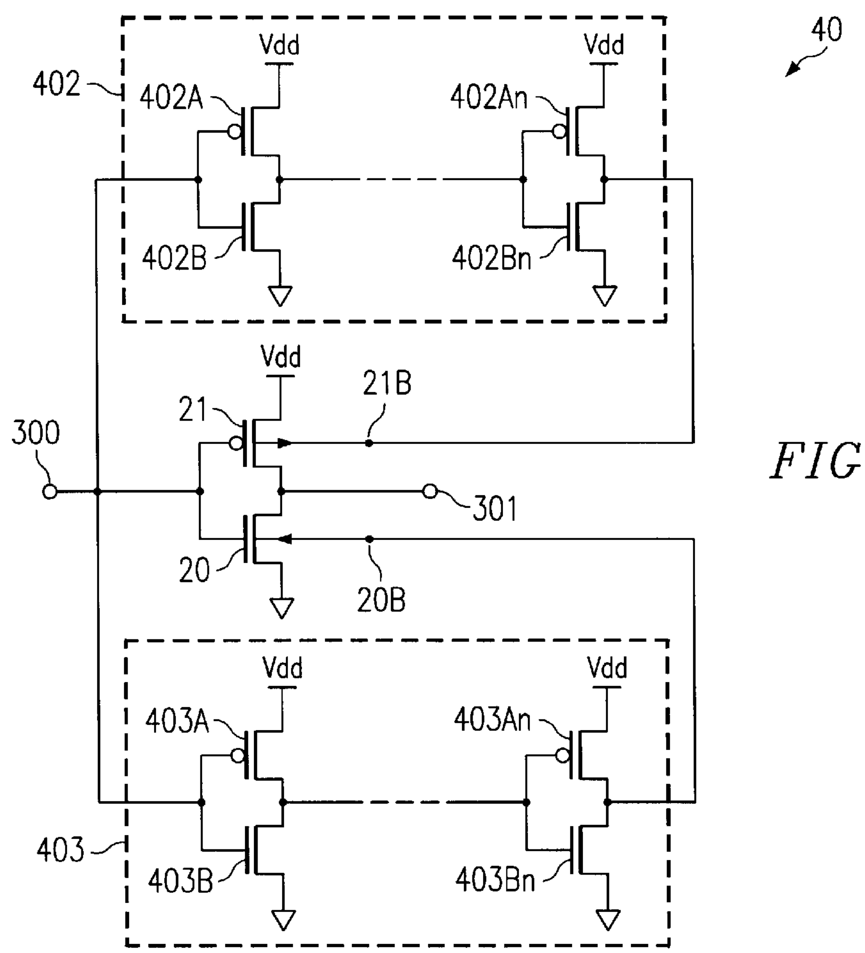
FIG. 4 is a circuit diagram illustrating a preferred embodiment of the present invention configured to manipulate the delay time.

Logic inverters constructed using CMOSFET devices having a floating body terminal generally exhibit undesirable operating traits due to the floating body condition. FIG. 1 shows a cross-sectional view of an nFET portion of a SOI CMOSFET device. SOI CMOSFET devices typically have such undesirable traits due to their floating body terminals. Substrate 100 is physically separated from source 101, drain 102, channel area 103, and gate 104 by buried oxide (BOx) 105. The nFET is separated from the pFET portion of the SOI CMOSFET by oxides 107. Body terminal 106 provides the connecting terminal for substrate 100 of the nFET device. BOx 105 dielectrically separates the source 101, gate 104, and drain 102 terminals of the device and effectively reduces the overall drain/source-to-body capacitance, which increases the switching speed of such devices. However, the floating body connection (i.e., the body connected neither to ground nor to one of either of source 101 or drain 102 terminals) typically causes the threshold voltage of the device to vary, due to the variations in the body bias of the device. The variation in body bias generally causes history dependent delay, which is the variation in delay that occurs in an SOI FET.

Another detrimental effect of SOI-constructed devices caused by the variable body bias, is the activation of a MOSFET's internal parasitic bipolar transistor. FIG. 1 shows this parasitic bipolar in the spatial relation of source 101, channel area 103, and drain 102. This arrangements creates an npn bipolar transistor when body terminal 106 is allowed to float to certain voltage levels. FIGS. 2A and 2B illustrate the circuit level result from this parasitic transistor. In FIG. 2A, SOI nFET 20 actually will comprise a typical nFET 200 with parasitic bipolar 201 connected across its drain and source terminals. Similarly, in FIG. 2B, SOI pFET 21 comprises typical pFET 202 with parasitic bipolar 203 connected across its drain and source terminals. As nVbias and pVbias change, parasitic bipolars 201 and 203 may activate, causing increased current to flow across the FET.

FIG. 3 illustrates a preferred embodiment of the present invention configured to manipulate the history dependent delay typically found in SOI FET devices. SOI-constructed CMOSFET inverter 30 comprises pFET 21 and nFET 20. Inverter 30 also has input 300 and output 301 for accepting input voltages/signals and providing output voltages/signals. In order to manipulate the delay times of inverter 30, body biasing inverters 302 and 303 are preferably connected into the circuit path.

Body biasing inverter 302, comprising pFET 302A and nFET 302B, has its input preferably connected to inverter input 300 and its output preferably connected to body terminal 21B of pFET 21. Body biasing inverter 303 also has an input preferably connected to inverter input 300 and an output preferably connected to body terminal 20B of nFET 20. Each of the inverters is connected to voltage source Vdd and to ground.

In operation, a logic low input voltage preferably provides a high logic voltage at body terminals 20B and 21B. With reference to FIGS. 2A and 2B, a high voltage at nVbias and pVbias turns parasitic bipolar 201 on and parasitic bipolar 203 off. Assuming for purposes of example that the logic high voltage equals Vdd and the logic low voltage equals ground or 0 volts, the logic low input to inverter 30, of FIG. 3, preferably creates a source-to-body voltage of 0 volts for pFET 21 and a source-to-body voltage equal to the emitter-base junction voltage of parasitic bipolar 201, of FIG. 2A. In silicon-based bipolar transistors the activated emitter-base junction voltage is generally around 0.7 volts. Therefore, using the configuration of the preferred embodiment of the present invention, inverter 30 will preferably have pVbs equal to 0 volts and nVbs equal to the emitter-base junction voltage of parasitic bipolar 201 during the output high-to-low transitions. This stability advantageously minimizes the effect of history dependent delay in high-to-low transitions, by stabilizing the body bias voltage of each of the FETs making up inverter 30.

Conversely, when a logic high input voltage is provided to input 300, low voltage levels are preferably provided at body terminals 20B and 21B. Low body bias voltages turn parasitic bipolar 203 on and parasitic bipolar 201 off. Assuming the same logic voltage levels as above, the low body bias voltages preferably create a source-to-body voltage of Vdd minus the emitter-base junction voltage of parasitic bipolar 203, of FIG. 2A, for pFET 21, and a source-to-body voltage of 0 volts for nFET 20. Therefore, using the configuration of the preferred embodiment of the present invention, inverter 30 will preferably have pVbs equal to Vdd minus the emitter-base junction voltage of parasitic bipolar 203 and nVbs equal to 0 volts during the output low-to-high transitions. This stability again advantageously minimizes the effect of history dependent delay in low-to-high transitions, by stabilizing the body bias voltage of each of the FETs making up inverter 30.

Inverter 30 from FIG. 3 shows single body biasing inverters inserted into the signal paths for biasing FETs 20 and 21. This configuration, with an odd number of such body biasing inverters is used to minimize the delay of inverter 30. FIG. 4 shows a generalized configuration of a SOI-constructed CMOSFET inverter in which the delay may be preferably minimized, where the number of body biasing inverters in body biasing networks 402 and 403 is odd, or in which the delay may be preferably maximized, where the number of body biasing inverters in body biasing networks 402 and 403 is even. The general operation of odd-numbered biasing inverters is the same as described for FIG. 3, with the inverted input voltage value biasing the respective body terminals of FETs 20 and 21. However, the operation of even-numbered biasing inverters is substantially different.

In an even-numbered inverter circuit, such as inverter 40 shown in FIG. 4, body biasing networks 402 and 403 preferably comprise an even number of inverters made up of pFETs 402A–402An and 403A–403An, and nFETs 402B–402Bn and 403B–403Bn (where 'n' is an even number). A low input voltage will preferably produce a corresponding low voltage for biasing the respective body terminals 20B and 21B. In biasing network 402, the low input voltage is inverted to a high voltage through the first inverter of FETs 402A and 402B, this high voltage is subsequently inverted again to a low voltage at the second inverter and will continue this sequence of inversion until the last even inverter of FETs 402An and 402Bn preferably produces a low voltage output. Biasing network 403 works in a similar manner.

For the high-to-low output transition of inverter 40, assuming the same logic voltage levels as above, the low body bias voltages preferably create a source-to-body voltage of Vdd minus the emitter-base junction voltage of parasitic bipolar 203, of FIG. 2A, for pFET 21, and a source-to-body voltage of 0 volts for nFET 20. Therefore, using the configuration of the preferred embodiment of the present invention with an even number of body biasing inverters, inverter 40 will preferably have pVbs equal to Vdd minus the emitter-base junction voltage of parasitic bipolar 203 and nVbs equal to 0 volts during the output high-to-low transitions. This stability advantageously maximizes the delay in high-to-low transitions, by stabilizing the body bias voltage of each of the FETs making up inverter 40.

Conversely for the low-to-high output transition of inverter 40, the logic high input to inverter 40, of FIG. 4, preferably creates a source-to-body voltage of 0 volts for pFET 21 and a source-to-body voltage equal to the emitter-base junction voltage of parasitic bipolar 201, of FIG. 2A. Therefore, using the configuration of the preferred embodiment of the present invention with an even number of body biasing inverters, inverter 40 will preferably have pVbs equal to 0 volts and nVbs equal to the emitter-base junction voltage of parasitic bipolar 201 during the output low-to-high transitions. This stability again advantageously maximizes the delay in low-to-high transitions, by stabilizing the body bias voltage of each of the FETs making up inverter 40.

Figure 5:
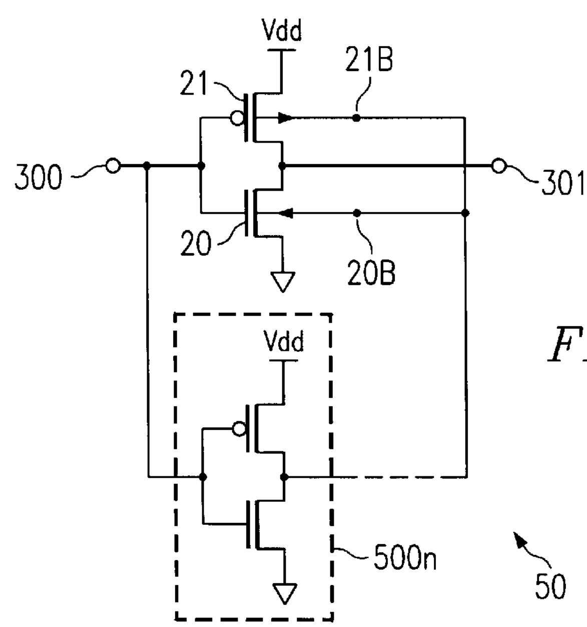
FIG. 5 is a circuit diagram illustrating a preferred embodiment of the present invention configured for minimizing circuit geometries.

FIG. 5 illustrates an alternative embodiment of the present invention, in which a single body biasing inverter network provides the appropriate biasing for the body or substrate of the main inverter's nFET and pFET. Inverter 50, with input 300 and output 301, comprises pFET 21 and nFET 20. The output of body biasing network 500*n* couples to each of body terminals 20B and 21B. The input of body biasing network 500*n* is connected to inverter input 300. Body biasing network 500*n* may comprise at least one CMOSFET inverter. As noted previously, when body biasing network 500*n* comprises an odd number of inverters, inverter 50 is configured to minimize the inverter delay. Conversely, when body biasing network 500*n* comprises an even number of inverters, inverter 50 is configured to maximize inverter delay. The operation of both configurations is similar to that described above. By providing a single network of body biasing inverters, the necessary chip-space or circuit size is preferably reduced allowing for a more densely-packed integrated circuit.

It should be noted that in preferred embodiments of the present invention, the body biasing inverters will preferably be smaller than the main inverter. This may be accomplished by adjusting the gate width-to-length ratios of the body biasing inverters.

It should also be noted that the body biasing inverters are also preferably SOI-constructed CMOSFET devices.

In alternative embodiments of the present invention, it may be desirable to configure the inventive inverter to minimize the delay time using an odd number of body biasing inverters greater than one. Although FIG. 3 illustrates a minimization configuration using only single body biasing inverters, any odd number of body biasing inverters may preferably achieve similar minimization results.

It should also be noted that, while the preferred embodiments of the present invention have been described using SOI-constructed CMOSFET devices, any CMOSFET device having a floating body connection may benefit from the disclosed invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A complementary metal oxide semiconductor field effect transistor (CMOSFET) inverter comprising:

a p-channel FET (pFET);

an n-channel FET (nFET), wherein said pFET and said nFET are connected gate terminal-to-gate terminal and drain terminal-to-drain terminal;

an inverter input connected to said connected gate terminals of said pFET and nFET;

an inverter output connected to said connected drain terminals of said pFET and nFET; and at least one body biasing inverter stage having an input connected to said inverter input and an output connected to a body terminal of said pFET and said nFET.

2. The CMOSFET inverter of claim 1 wherein said at least one body biasing inverter stage comprises at least one gate and drain connected pFET and nFET inverters.

3. The CMOSFET inverter of claim 1 wherein said inverter and said at least one gate and drain connected pFET and nFET inverters comprise silicon on insulator (SOI)-constructed CMOSFET devices.

4. The CMOSFET inverter of claim 3 wherein a delay time of said SOI-constructed CMOSFET inverter is minimized by placing an odd number of said at least one body biasing inverter stage between said inverter input and said body terminals of said nFET and said pFET.

5. The CMOSFET inverter of claim 3 wherein a delay time of said SOI-constructed CMOSFET inverter is maximized by placing an even number of said at least one body biasing inverter stage between said inverter input and said body terminals of said nFET and said pFET.

6. The CMOSFET inverter of claim 2 wherein said at least one body biasing inverter stage comprises:

at least one first gate and drain connected pFET and nFET inverter with an input connected to said inverter input and an output connected to said body terminal of said inverter pFET; and at least one second gate and drain connected pFET and nFET inverter with an input connected to said inverter input and an output connected to said body terminal of said inverter nFET.

7. A method for manipulating a delay time in a silicon on insulator-(SOI) constructed complementary metal oxide semiconductor field effect transistor (CMOSFET) inverter comprising the steps of:

connecting inputs of at least one biasing logic inverter stage to an input of said SOI-constructed CMOSFET inverter; and connecting an output of said at least one biasing logic inverter stage to a body terminal of said FET devices comprising said SOI-constructed CMOSFET inverter.

8. The method of claim 7 further comprising the step of:

maintaining stable body voltages on a p-channel FET (pFET) and n-channel FET (nFET) of said SOI-constructed CMOSFET inverter during circuit transitions.

9. The method of claim 8 wherein said maintaining step comprises supplying said body terminals of said pFET and said nFET with a stable voltage.

10. The method of claim 8 wherein minimizing said delay time comprises the step of:

connecting an odd number of said biasing logic inverter stages into said SOI-constructed CMOSFET inverter, wherein said stable body voltage comprises an inversion of a voltage applied to said input of said SOI-constructed CMOSFET inverter.

11. The method of claim 8 wherein maximizing said delay time comprises the step of:

connecting an even number of said biasing logic inverter stages into said SOI-constructed CMOSFET inverter, wherein said stable body voltage comprises a voltage value applied to said input of said SOI-constructed CMOSFET inverter.

12. A complementary metal oxide semiconductor field effect transistor (CMOSFET) inverter having a floating body configuration comprising:

an input;

an output; and at least one body biasing network for providing bias voltages to a body terminal of a p-channel FET (pFET) and an n-channel FET (nFET) of said CMOSFET inverter wherein said at least one body biasing network comprises:

at least one CMOSFET biasing inverter having an input connected to said inverter input and an output connected to said body terminal of said inverter pFET and said inverter nFET.

13. The inverter of claim 12 wherein said inverter, said at least one CMOSFET biasing inverter comprise silicon on insulator-(SOI) constructed CMOSFET devices.

14. The inverter of claim 13 wherein a delay time of said inverter is minimized by connecting an odd number of said at least one CMOSFET biasing inverters between said inverter input and said body terminal of said inverter pFET and said inverter nFET.

15. The inverter of claim 13 wherein a delay time of said inverter is maximized by connecting an even number of said at least one CMOSFET biasing inverters between said inverter input and said body terminal of said inverter pFET and said inverter nFET.

16. A complementary metal oxide semiconductor field effect transistor (CMOSFET) inverter having a floating body configuration comprising:

an input;

an output;

at least one body biasing network for providing bias voltages to a body terminal of a p-channel FET (pFET) and an n-channel FET (nFET) of said CMOSFET inverter;

at least one first CMOSFET biasing inverter having an input connected to said inverter input and an output connected to said body terminal of said inverter pFET; and at least one second CMOSFET biasing inverter having an input connected to said inverter input and an output connected to said body terminal of said inverter nFET.

* * * * *